(12) United States Patent
Yamaji

(10) Patent No.: US 7,015,572 B2
(45) Date of Patent: Mar. 21, 2006

(54) THREE-DIMENSIONALLY MOUNTED SEMICONDUCTOR MODULE AND THREE-DIMENSIONALLY MOUNTED SEMICONDUCTOR SYSTEM

(75) Inventor: Yasuhiro Yamaji, Tsukuba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/864,512

(22) Filed: Jun. 10, 2004

(65) Prior Publication Data

US 2004/0251530 A1 Dec. 16, 2004

(30) Foreign Application Priority Data

Jun. 12, 2003 (JP) .............................. 2003-168119

(51) Int. Cl.
*H01L 23/02* (2006.01)
(52) U.S. Cl. ...................................... 257/686; 257/714
(58) Field of Classification Search ................ 257/686, 257/777, 778, 714, 783
See application file for complete search history.

(56) References Cited

U.S. PATENT DOCUMENTS 6,121,682 A * 9/2000 Kim ............................ 257/723
6,522,015 B1 * 2/2003 Glenn et al. ................. 257/777
6,717,812 B1 * 4/2004 Pinjala et al. ................ 361/699
6,876,074 B1 * 4/2005 Kim ............................ 257/686

OTHER PUBLICATIONS

Tuckerman et al; "High-Performance Heat Sinking for VLSI"; IEEE Electron Device Letters, vol. EDL-2, No. 5, pp. 126-129, (1981).
Chen et al.; "Direct Liquid Cooling of a Stacked Multichip Module"; Electronics Packing Technology Conference, pp. 380-384, (2002).

* cited by examiner

*Primary Examiner*—S. V. Clark
(74) *Attorney, Agent, or Firm*—Finnegan, Henderson, Farabow, Garrett & Dunner, L.L.P.

(57) ABSTRACT

Semiconductor chips are stacked on a first main surface of an interconnect substrate. The semiconductor chips have a base and connection bumps. Mutually facing two of the bases and the interconnect substrate are apart from each other. The connection bumps electrically connect the mutually facing two of the bases and the interconnect substrate together. Insulating sealing members seal the connection bumps and fill spaces between the mutually facing two of the base and the interconnect substrate. The sealing members have a cavity penetrating the sealing member.

19 Claims, 11 Drawing Sheets

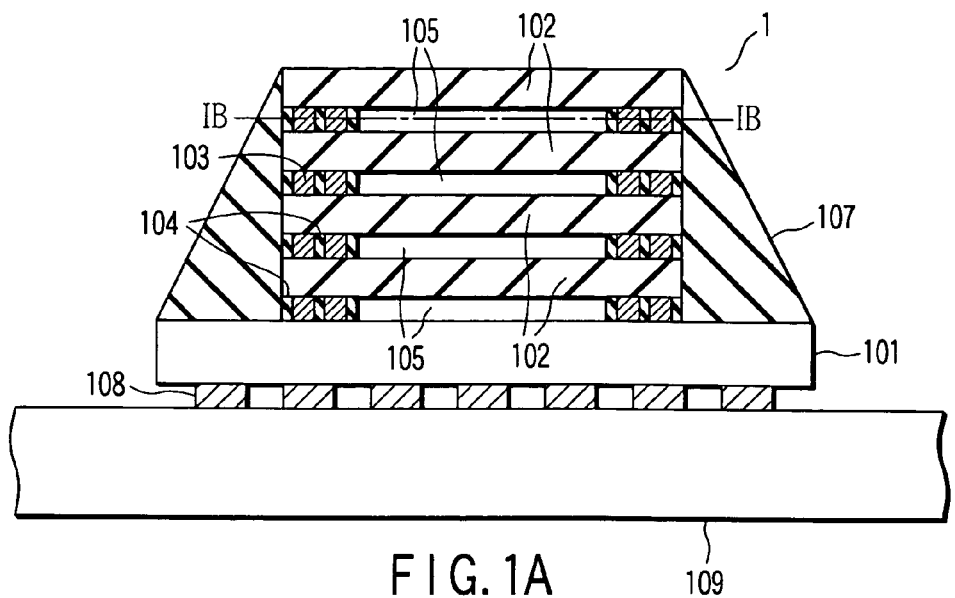
F I G. 1A
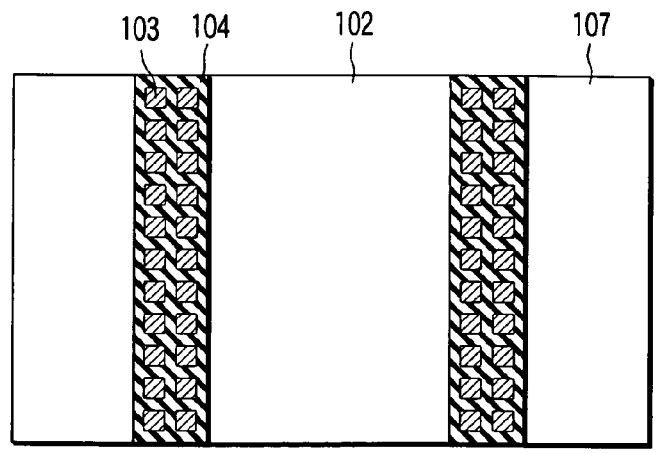
F I G. 1B
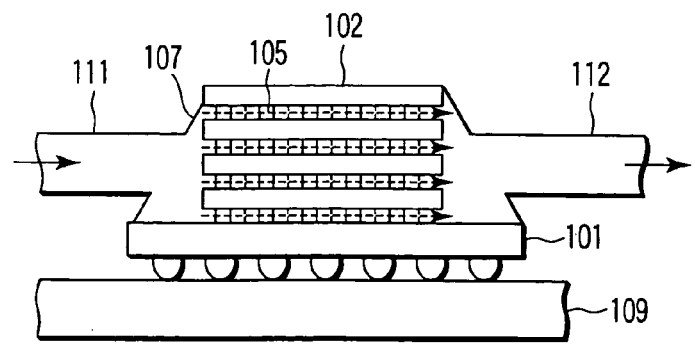
F I G. 2

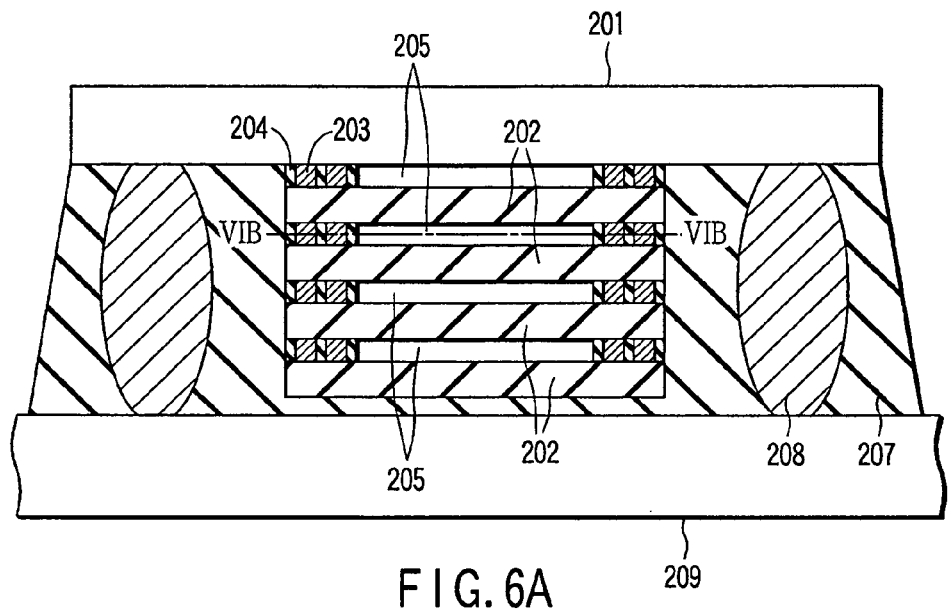
F I G. 6A
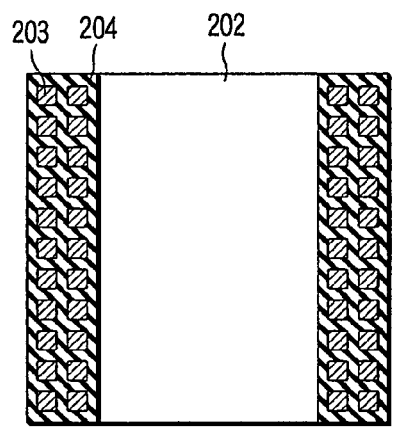
F I G. 6B
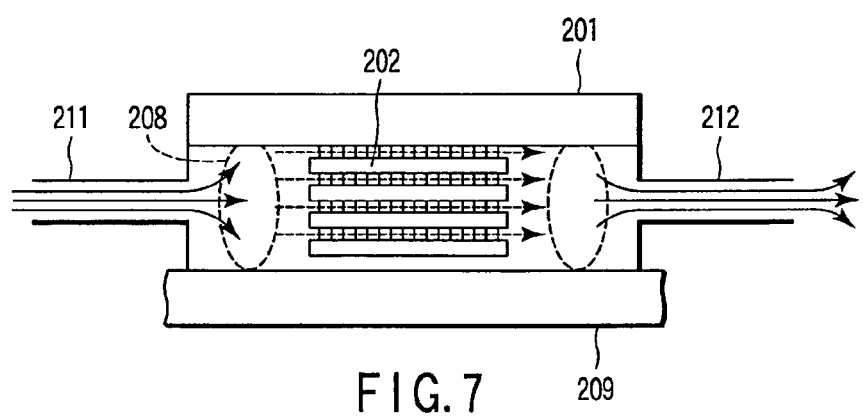
F I G. 7

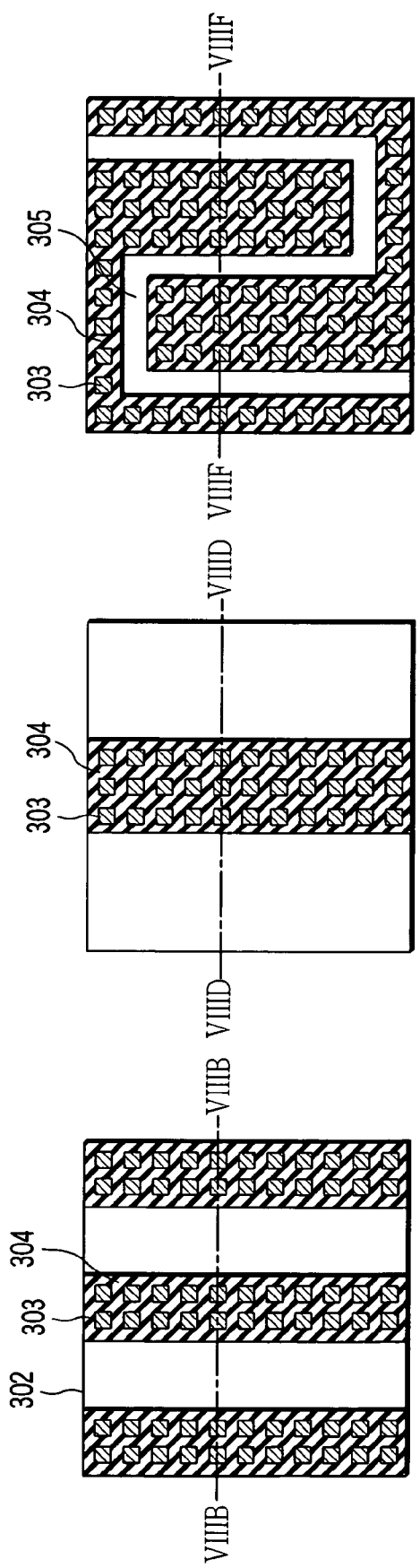
FIG. 8A
FIG. 8C
FIG. 8E
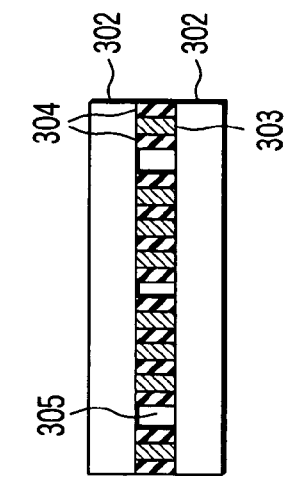
FIG. 8B
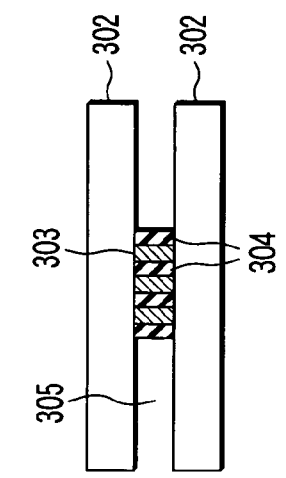
FIG. 8D
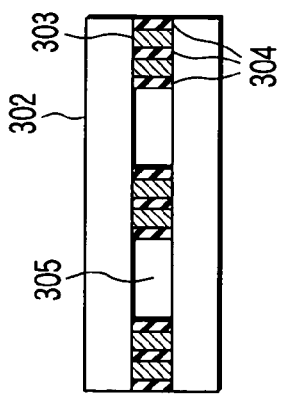
FIG. 8F

THREE-DIMENSIONALLY MOUNTED SEMICONDUCTOR MODULE AND THREE-DIMENSIONALLY MOUNTED SEMICONDUCTOR SYSTEM

CROSS-REFERENCE TO RELATED APPLICATIONS

This application is based upon and claims the benefit of priority from prior Japanese Patent Application No. 2003-168119, filed Jun. 12, 2003, the entire contents of which are incorporated herein by reference.

BACKGROUND OF THE INVENTION

1. Field of the Invention

The present invention relates to a three-dimensionally mounted semiconductor module, and in particular, to a three-dimensionally mounted semiconductor module in which stacked semiconductor chips are mounted on an interconnect substrate, with an improved cooling structure. The present invention also relates to a three-dimensionally mounted semiconductor system in which the three-dimensionally mounted semiconductor module is mounted.

2. Description of the Related Art

Conventional stacked-type three-dimensionally mounted semiconductor modules are configured so that when a cooling operation is performed in the system, the module is indirectly cooled by being joined to a radiator, a heat pipe, or the like or is directly cooled by being immersed into a liquid, as shown in FIGS. 9A to 9C.

FIG. 9A is a sectional view of a large and small chip stacked type. FIG. 9B is a sectional view of a TCP (Tape Carrier Package) stacked type. FIG. 9C is a sectional view of a chip-stacked type. In the figures, reference numeral 601 denotes a mounting substrate, and reference numeral 602 denotes an interposer. Reference numerals 603 and 604 denote semiconductor chips. Reference numerals 605, 606, and 607 denote a bonding wire, a sealing resin, and a radiator, respectively. Reference numerals 611, 613, and 614 denote a TCP, an outer lead, and a heat pipe, respectively. Reference numerals 621, 622, and 623 denote a semiconductor chip, a sealing resin, and a channel wall, respectively.

However, such cooling structures create the problems described below. With an indirect cooling structure utilizing thermal conduction as shown in FIGS. 9A and 9B, a chip located in an inner layer of stacked semiconductor chips must be cooled via the chips located on a top and bottom surfaces, respectively, of this chip. In this case, disadvantageously, an increase in power consumption makes cooling difficult to lead the chip in the inner layer to cause an abnormally large temperature rise. Further, even if the semiconductor module is immersed into a liquid as shown in FIG. 9C, only the sides of the semiconductor module contact with the liquid, that is, the area of the semiconductor module which contacts with the liquid is limited. As a result, the cooling of the inner layer chips is also difficult.

In particular, owing to its thermal design, the chip stacked type module has a disadvantageous structure in which the "cooled surface area of the module does not increase even with an increase in the overall heat flux of the module accompanying an increase in the number of chips stacked". Accordingly, with an increase in the power consumption of the device, the cooling is becoming more difficult.

As another conventional example, a method using a heat sink which has channel structure of micron-order (called microchannel) has been reported (refer to, for example, IEEE ELECTRON DEVICE LETTERS, VOL. EDL-2, No. 5, p. 126 to 129, MAY 1981) in order to achieve more efficient cooling. This method is shown in FIGS. 10A and 10B. In the figures, reference numerals 701, 702, 704, and 705 denote a semiconductor chip, a connection bump, a cover plate, and a microchannel machined portion, respectively. However, to implement this structure, it is essential to have a complicate processing on a back surface of the semiconductor chip or the like. This complicates the manufacturing process and increases the costs of the whole semiconductor module.

Thus, in the prior art, with a three-dimensionally mounted semiconductor module in which semiconductor chips are stacked on an interconnect substrate in a vertical direction, cooling efficiency decreases with an increase in the number of chips stacked. In particular, it is disadvantageously difficult to adequately cool semiconductor chips in inner layers. Further, complicated micromachining is required in order to utilize the microchannel cooling. This disadvantageously complicates the manufacturing process and increases manufacturing costs.

BRIEF SUMMARY OF THE INVENTION

According to a first aspect of the present invention, there is provided a semiconductor module comprising: an interconnect substrate having a first main surface; a plurality of semiconductor chips stacked on the first main surface, the semiconductor chips having a base and connection bumps, mutually facing two of the bases and the interconnect substrate being apart from each other, the connection bumps electrically connecting the mutually facing two of the bases and the interconnect substrate together; and a plurality of insulating sealing members which seal the connection bumps, the sealing members filling spaces between the mutually facing two of the base and the interconnect substrate, the sealing members having a cavity penetrating the sealing members.

According to a second aspect of the present invention, there is provided a semiconductor module comprising: an interconnect substrate having a first main surface; a plurality of semiconductor chips stacked on the first main surface, the semiconductor chips having a base and connection bumps, mutually facing two of the bases and the interconnect substrate being apart from each other, the connection bumps electrically connecting the mutually facing two of the bases and the interconnect substrate together, the connection bumps being in line in a first plane along the first main surface to form paths; and a plurality of insulating sealing members which seal the connection bumps without burying the paths.

BRIEF DESCRIPTION OF THE SEVERAL VIEWS OF THE DRAWING

FIG. 1A is a side sectional view schematically showing the configuration of a three-dimensionally mounted semiconductor module according to a first embodiment;

FIG. 1B is a sectional view taken along a line IB—IB in FIG. 1A;

FIG. 2 is a sectional view schematically showing that conduits are connected to the three-dimensionally mounted semiconductor module according to the first embodiment;

FIG. 6A is a sectional view schematically showing the configuration of a three-dimensionally mounted semiconductor module according to a second embodiment;

FIG. 6B is a sectional view taken along a line VIB—VIB in FIG. 6A;

FIG. 7 is a sectional view schematically showing that conduits are connected to the three-dimensionally mounted semiconductor module according to the second embodiment;

FIGS. 8A, 8B, 8C, 8D, 8E, 8F are sectional views of a third embodiment, showing forms of channels each formed between chips;

DETAILED DESCRIPTION OF THE INVENTION

Figure 3A:
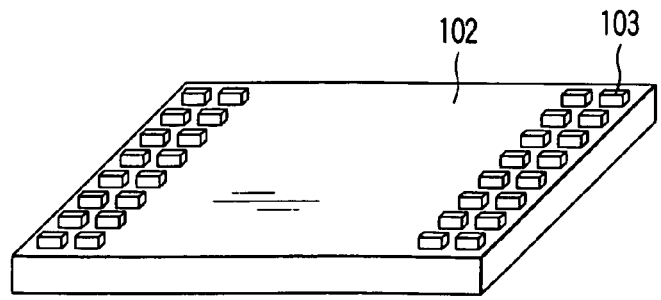
FIGS. 3A, 3B, and 3C are views sequentially showing steps of manufacturing the three-dimensionally mounted semiconductor module according to the first embodiment.

The present invention will be described below in detail with reference to illustrated embodiments.

(First Embodiment)

FIGS. 1A and 1B schematically illustrate a three-dimensionally mounted semiconductor module 1 according to a first embodiment of the present invention. FIG. 1A is a side sectional view. FIG. 1B is a sectional view taken along a line IB—IB in FIG. 1A.

A plurality of (in the figures, four) semiconductor chips 102 are stacked on an interposer substrate (interconnect substrate) 101 in a vertical direction. The substrate is composed of silicon or an organic material. Each of the semiconductor chips 102 includes connection bumps 103 on its bottom surface or on both its top and bottom surfaces. The bumps 103 electrically connect the adjacent chips 102 together and the lowest chip 102 and the substrate 101 together.

The connection bumps 103 of each of the semiconductor chips 102 are provided near each end, that is, each of two opposite sides (two sides in the lateral direction of the drawings) of the chip 102. In the gaps between the chips and between the chip and the substrate, the connection bumps 103 are sealed with a nonconductive sealing resin 104 such as an epoxy resin. On the other hand, in the areas between the chips and between the chip and the substrate except for the sealed parts, cavity (=channel) 105 is formed so that a back or front surface of each chip is exposed. The cavity extends from one side (the side closer to the reader in FIG. 1A or to the bottom edge of the drawing in FIG. 1B) to the opposite side (the side further from the reader in FIG. 1A or to the top edge of the drawing in FIG. 1B) of the remaining two sides rather than the above two sides.

Channel encapsulation material 107 that covers the module and part of outer conduits is provided on sides of the semiconductor chips 102 stacked as described above. The encapsulation material 107 closes the two sides of each semiconductor chip 102 at which bumps 103 are formed. On each of the other two sides of the semiconductor chip 102, the encapsulation material 107 has openings connected with all the channels 105. The openings are connected to conduits, described later, so that a cooling fluid can be introduced into all the channels 105. Like the sealing resin 104, the encapsulation material 107 may be formed of an epoxy resin.

The interposer substrate 101 is mounted on a mounting substrate 109. The substrates 101 and 109 are electrically connected together via substrate connecting terminals 108.

FIG. 2 is a sectional view schematically showing that conduits (cooling fluid supply pipes) are connected to the three-dimensionally mounted semiconductor module. The semiconductor module in FIG. 2 has been rotated by 90° from the same semiconductor module shown in FIG. 1. Conduits 111 and 112 are connected to the encapsulation material 107. A cooling liquid, for example, water is introduced through the conduit 111. The cooling liquid passes through the channels 105 in the semiconductor module and is then discharged via the conduit 112.

In this case, the pitch and height of each of the connection bumps 103 are each less than 1 mm (several $\mu$m to several hundred $\mu$m) For example, the pitch is 20 $\mu$m and the height is 10 $\mu$m. Accordingly, the channels 105 are very fine gaps having a size on the order of microns.

With such a structure, the liquid introduced through the conduit 111 is distributed to the channels 105 each present over and under the corresponding chips. The distributed streams of the liquid then flow in parallel to enable the chips to be cooled. Further, the micron-order channels are generally called "microchannels" and are known to exhibit a very high thermal conduction characteristic compared to normal channels. The channels 105, which are very fine gaps having a size on the order of microns, have characteristics that can achieve a high cooling performance at the microchannel level.

Figure 12:
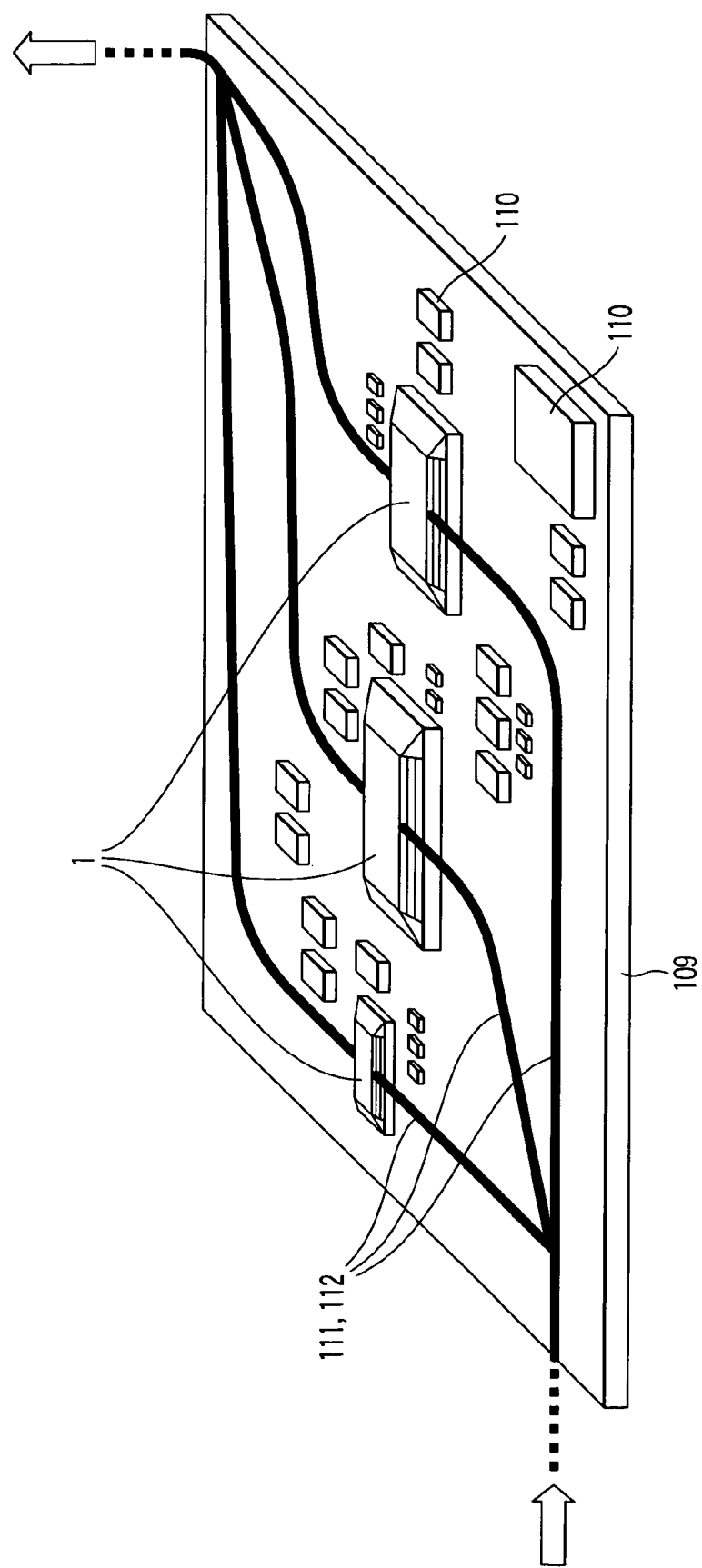
FIG. 12 is a perspective view showing a three-dimensionally mounted semiconductor system using the three-dimensionally mounted semiconductor modules according to the first embodiment.

Further, as shown in FIG. 12, a three-dimensionally mounted semiconductor system can be constructed by providing some structures shown in FIG. 2 on the mounting substrate 109 and connecting the conduits to each semiconductor module. Various semiconductor devices 110 other than the semiconductor module 1 according to the present embodiment are mounted on the mounting substrate 109 to constitute a part of the semiconductor system. Means (not shown) for supplying a cooling fluid is connected to one end of each of the conduits 111 and 112. A cooling system such as a cooling plate or a cooling fan is connected to the other end of the conduit.

The results of the inventors' experiments show that at most 300 $\mu$m in height of the channels can achieve a highly efficient cooling at the level of so-called microchannel cooling. The results of the experiments also indicate that a very high cooling performance can be achieved with the height of at most 100 $\mu$m or 50 $\mu$m depending on applications.

Furthermore, with a three-dimensionally mounted semiconductor system in which three-dimensionally mounted semiconductor modules are mounted on the mounting substrate 109, a sufficient cooling effect was obtained even if modules are connecting in series via the conduits to form a single line for cooling. In this case, the number of conduits arranged on the mounting substrate 109 can be reduced compared to the individual cooling of the modules.

Now, with reference to FIGS. 3A to 3C and 4A to 4C, description will be given of a method of manufacturing a three-dimensionally mounted semiconductor module according to the present embodiment.

First, as shown in FIG. 3A, the semiconductor chip 102 with bumps is provided. The bumps 103 are formed near opposite two sides of the semiconductor chip as previously described.

Figure 3B:
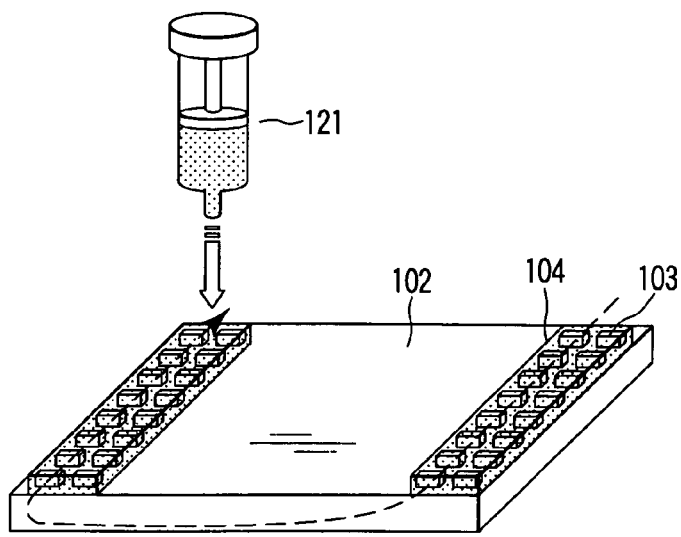

Then, as shown in FIG. 3B, an applying syringe 121 is used to apply a liquid sealing resin 104 to the semiconductor chip 102 to seal the connection bumps 103. At this time, the resin 104 is not hardened.

Figure 3C:
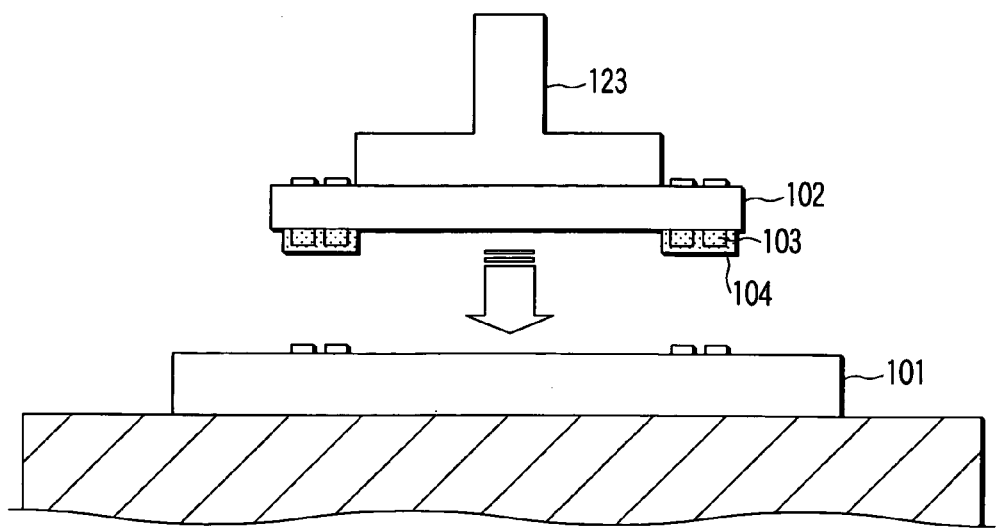

Then, as shown in FIG. 3C, the semiconductor chip 102 is turned upside down and then joined to the connection bumps 103 on the back surface of the interposer substrate 101, on which the semiconductor chip 102 is stacked, or on the back surface of another semiconductor chip 102 so that the unhardened resin 104 is given a pressure. Before and after the bump connection, a heating stage, a bonding tool 123, or the like is used to heat the semiconductor chip. Then, the sealing resin 104 is hardened to form the channel 105 between the semiconductor chips.

Figure 4A:
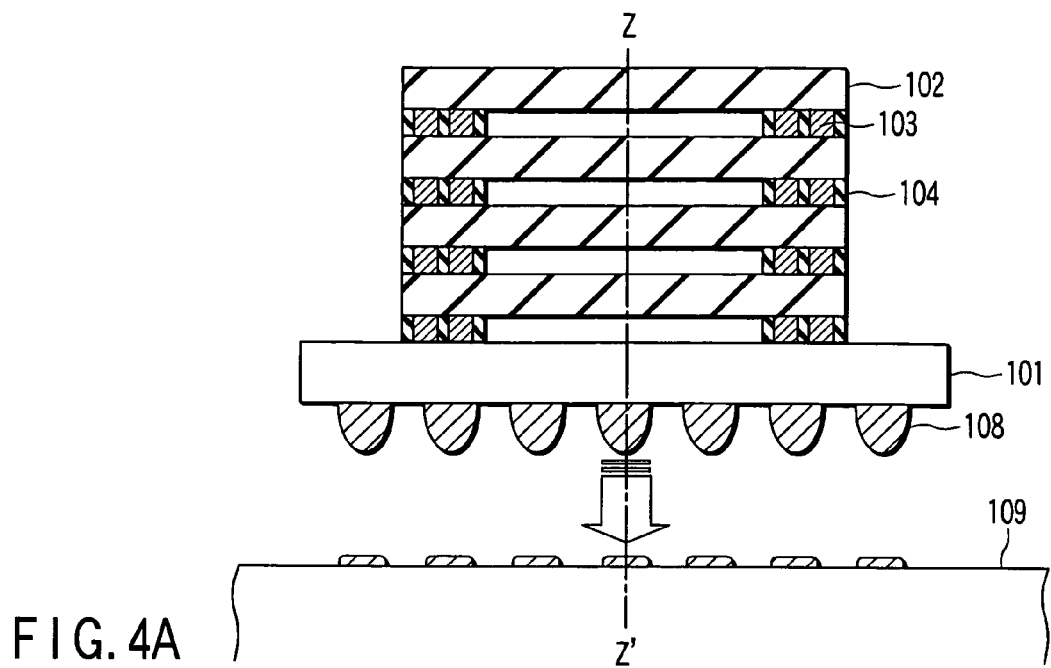
FIGS. 4A, 4B, and 4C are views sequentially showing steps of manufacturing the three-dimensionally mounted semiconductor module according to the first embodiment.

The above series of operations are sequentially repeated to complete a stacked module in which the channels 105 are formed so that each of them is located between the semiconductor chips as shown in FIG. 4A. The stacked module is then mounted on the mounting substrate 109.

Figure 4B:
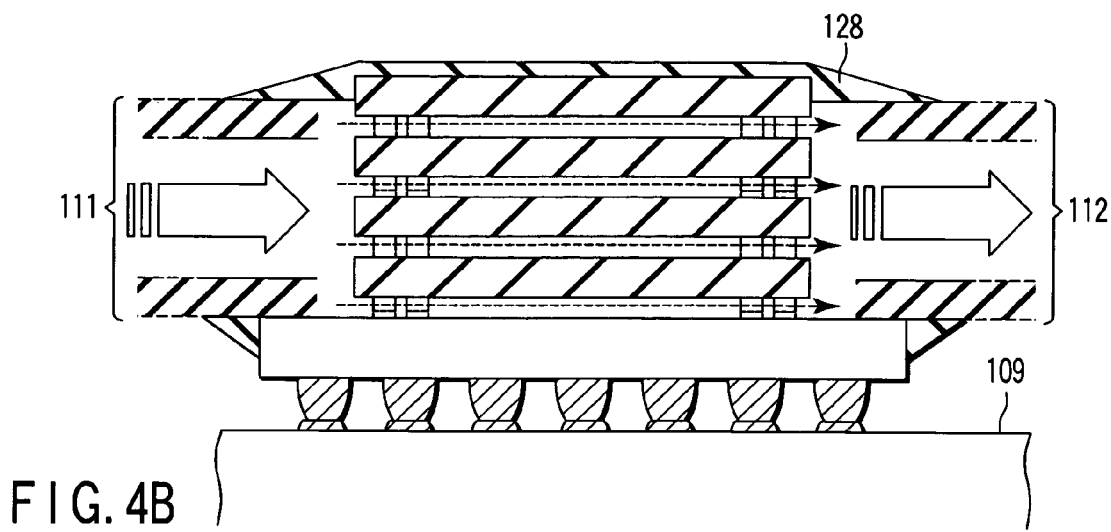

Then, as shown in FIG. 4B, the fluid conduits 111 and 112, which can flow fluid, are joined to the respective sides of the stacked module using a conduit connecting resin 128. When a liquid such as water or a gas such as air or an inert gas is supplied through the fluid conduit 111, the fluid flows through the channels 105. Consequently, it is possible to efficiently reduce heat generated by the semiconductor chips 102.

Figure 4C:
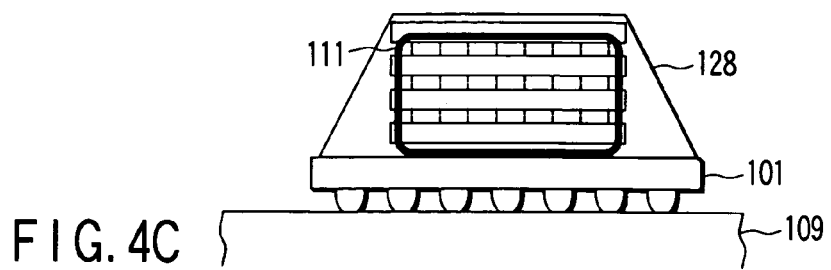

FIG. 4C shows the module in FIG. 4B as viewed from the front of the module. In this figure, the conduits are shaped like rectangles. Various structures may be used to connect the fluid conduit 111 to the stacked module. The direction and size of the conduits are not limited as long as fluid flows through all of the channels 105.

Figure 5:
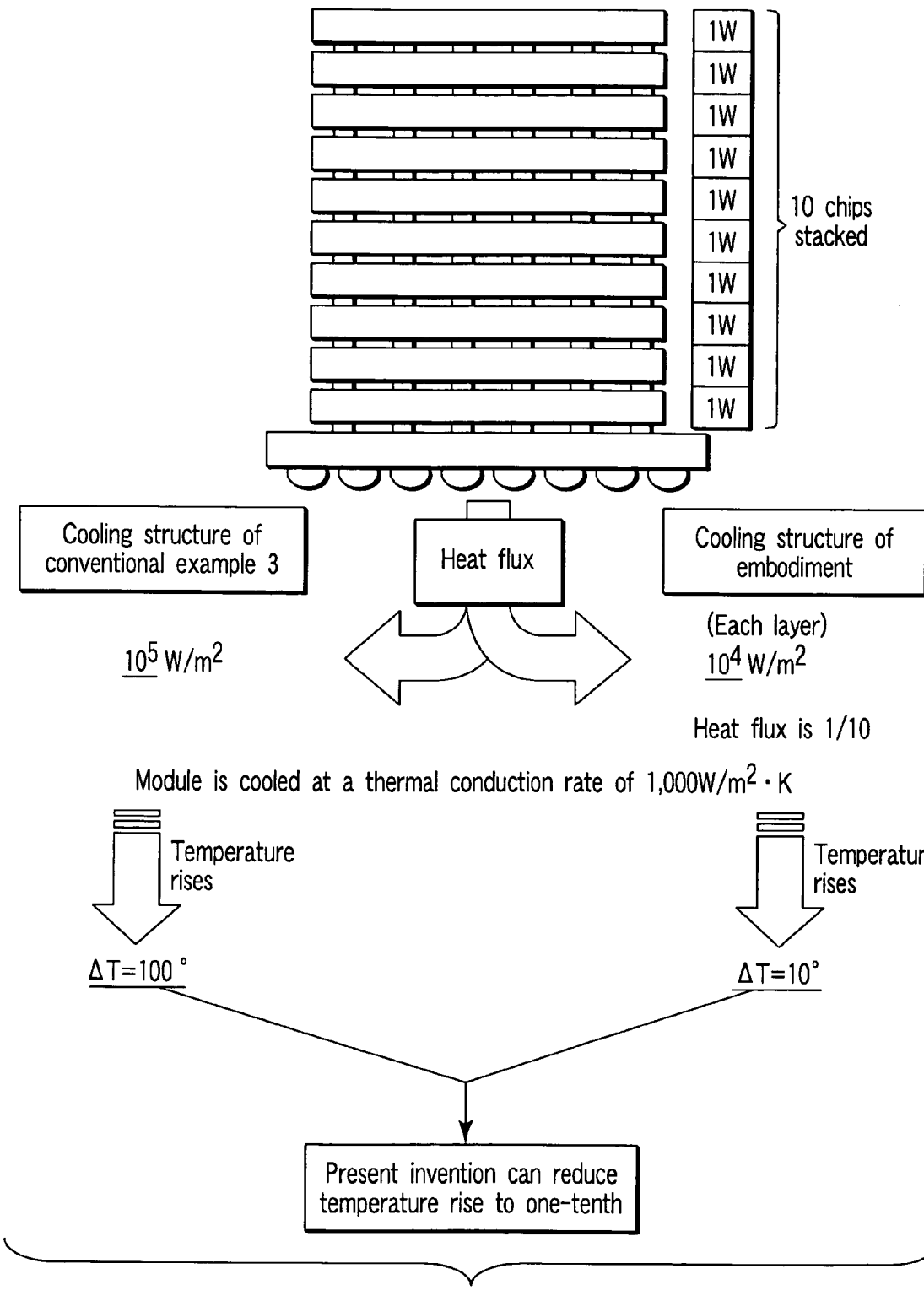
FIG. 5 is a diagram illustrating the effects of the first embodiment.

FIG. 5 shows a module in which 10 chips each having a size of 10 mm×10 mm and generating heat of 1 W are stacked, in order to indicate the effects of the present embodiment. In this figure, a rise in the temperature of the module is roughly estimated in connection with the case where the module is cooled at a thermal conduction rate of 1,000 W/m$^2$·K. As shown in the figure, the heat flux in the embodiment is $10^4$ W/m$^2$ (in each layer), compared to $10^5$ W/m$^2$ in a conventional example. That is, the heat flux in the embodiment is one-tenth of the conventional example. According to simple calculations, when the module is cooled at a thermal conduction rate of 1,000 W/m$^2$·K, a rise in temperature is 10° in the embodiment, compared to 100° in the conventional example. This shows that the structure of the embodiment can reduce the temperature rise to one-tenth. Thus, even if the heat flux of the module increases as a result an increase in the number of chips stacked, the structure of the present embodiment can easily deal with cooling without the need to significantly change the structure.

Figure 9A:
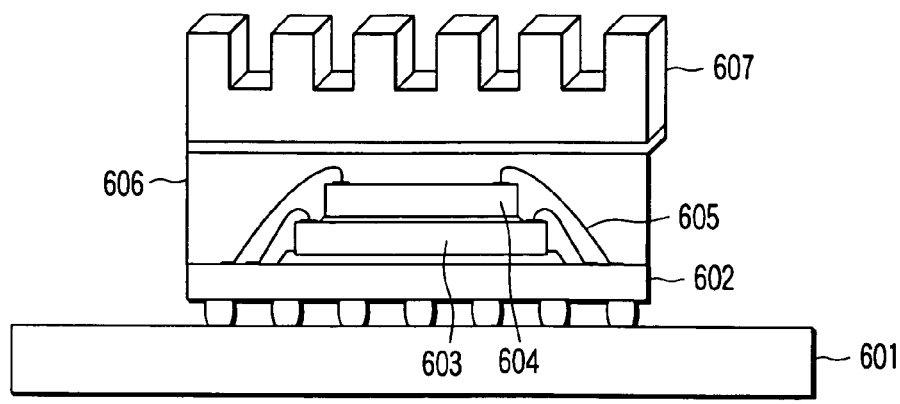
FIGS. 9A, 9B, and 9C are sectional views schematically showing the configuration of a conventional three-dimensionally mounted semiconductor module.
Figure 9B:
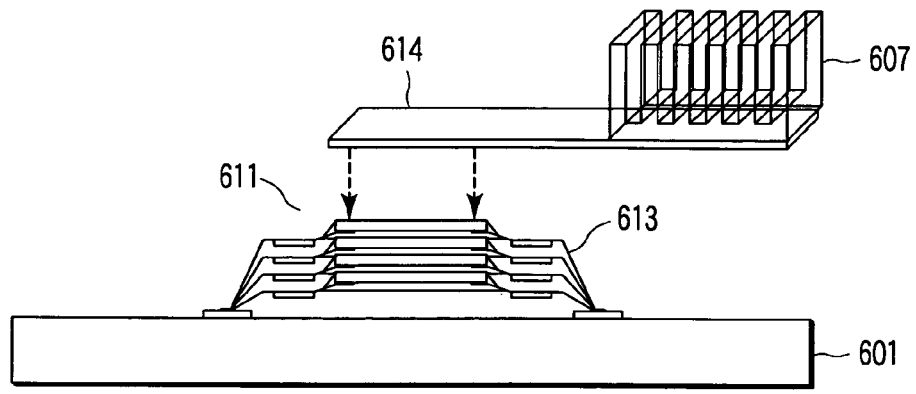
Figure 9C:
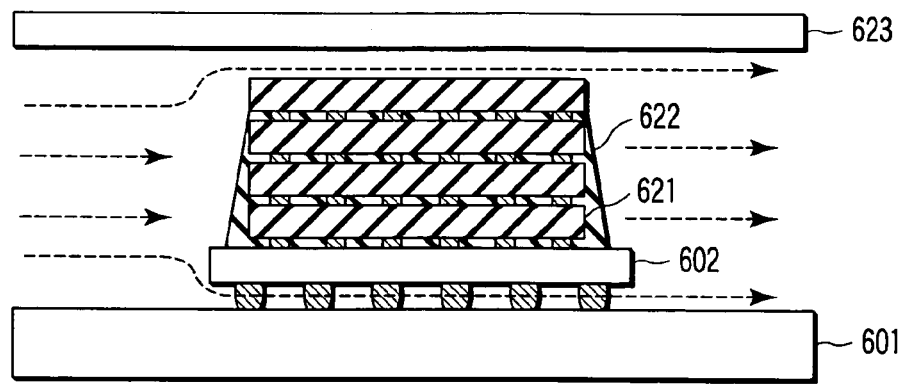
Figure 10A:
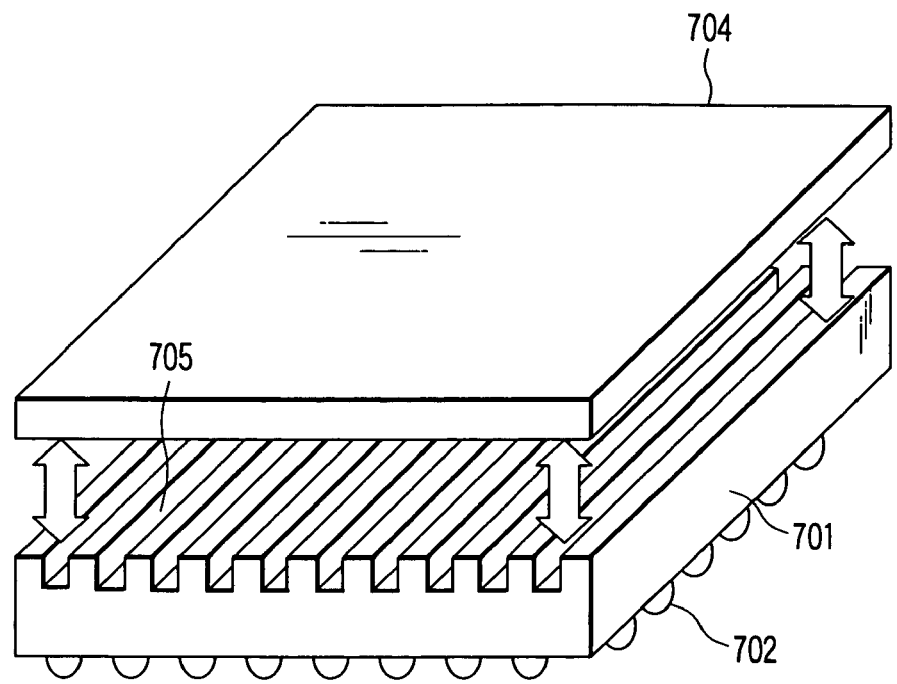
FIGS. 10A and 10B are perspective views showing an example of a conventional microchannel cooling structure.
Figure 10B:
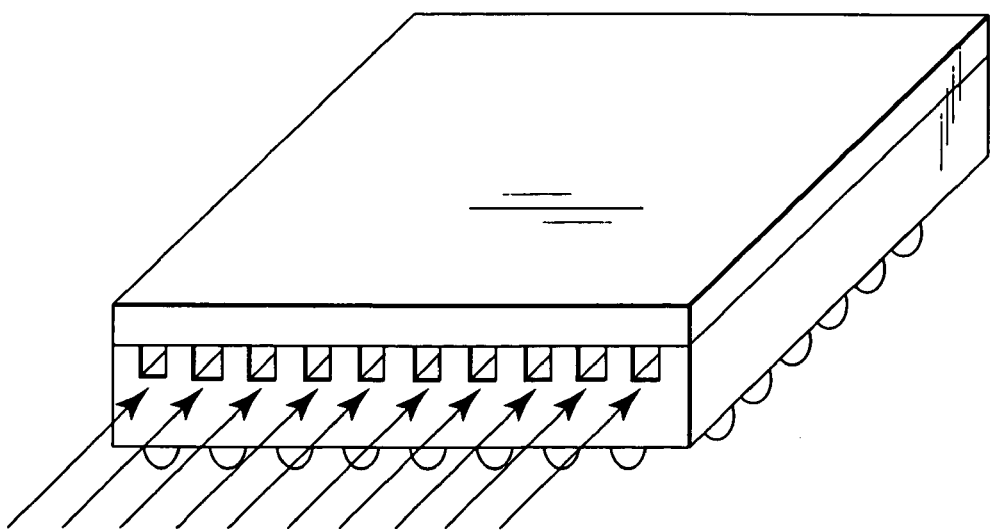

With the conventional structure shown in FIG. 9C, it is possible to form a channel between the chips to achieve efficient cooling, by omitting the sealing of the space between the chips with the resin. However, in this case, the connection bumps of the semiconductor chip are exposed. If the semiconductor chip is cooled in a liquid, the bump connections disadvantageously undergo chemical corrosion or the like, thus making the connections less reliable. Moreover, bump-connection failure is likely to result from a possible misfit stress generated at the joined bump portions because of a difference in thermal expansion between the interposer substrate and the semiconductor chip.

In the present embodiment, since the connection bumps are sealed with the resin, the chemical corrosion of the bump connections and other problems are avoided. Moreover, the presence of the sealing resin relaxes the possible misfit stress generated at the joined bump portions because of the difference in thermal expansion between the interposer substrate and the semiconductor chip. This makes it possible to suppress bump-connection failure caused by thermal fatigue or the like.

Further, the conventional structure shown in FIG. 9C cannot guide the stream of a fluid flowing through the gap between the chips in a required direction. Thus, structural restrictions are imposed on the cooling of a system in which modules of the conventional structure are mounted. This significantly reduces the degree of freedom. In contrast, in the present embodiment, any forms of channels extending in any directions can be formed in accordance with a system in which modules of the present embodiment are mounted. Accordingly, the channels can be freely aligned with a cooler of the system. This significantly increases the degree of freedom for the system. Moreover, the channel can be formed only in a main heated area of each semiconductor chip. It is thus possible to construct a very compact and efficient cooling system.

Thus, according to the present embodiment, in a three-dimensionally mounted semiconductor module, the semiconductor chips 102 are stacked on the interposer substrate 101, the vertically adjacent chips are electrically connected together, and the lowest chip and the substrate are electrically connected together, the presence of the fine gaps having a size on the order of microns provide an efficient cooling structure based on the microchannel cooling without the need for special machining of the semiconductor chips 102.

Further, the cooling space is composed only of the gaps in the chip-stacked portion. It is thus unnecessary to install a cooler such as a large heat sink. This makes it possible to provide a compact and efficient cooling structure with a sharply reduced mounting space. Moreover, by placing only one fluid conduit outside the module, it is possible to simultaneously cool the all chips while maintaining a uniform efficiency. Further, the module is cooled utilizing only the gaps in the chip-stacked portion except for the electric connections. This avoids problems such as chemical corrosion, which may occur if the module is cooled by being immersed in a liquid. Therefore, the cooling can be accomplished while maintaining reliable connections.

(Second Embodiment)

FIGS. 6A and 6B schematically illustrate a three-dimensionally mounted semiconductor module 2 according to a second embodiment of the present invention. FIG. 6A is a side sectional view. FIG. 6B is a sectional view taken along a line VIB—VIB in FIG. 6A. Reference numerals 201 to 209 in FIGS. 6A and 6B correspond to reference numerals 101 to 109 in FIGS. 1A and 1B.

In the previously described first embodiment, the semiconductor chips 102 and the substrate connecting terminals 108 are mounted on the respective opposite surfaces of the interposer substrate 101 (face-up structure). In contrast, in the present embodiment, semiconductor chips 202 and substrate connecting terminals 208 are mounted on the same surface of an interposer substrate 201 (face-down structure).

Specifically, semiconductor chips 202 are stacked in a central portion of a bottom surface of the interposer substrate 201. Bumps 203 electrically connect the adjacent chips 202 together and the lowest chip 202 and the substrate 201 together. Substrate connecting terminals 208 are provided in a peripheral portion of the bottom surface of the interposer substrate 201. The interposer substrate 201 is mounted on a mounting substrate 209 via these terminals 208 and is electrically connected to the mounting substrate 209.

A conduit connecting resin 207 is provided between the interposer substrate 201 and the mounting substrate 209 to seal the connection terminals 208. The conduit connecting resin 207 has openings that are in communication with channels in surfaces that are different from and parallel to the sheet of the drawing. As shown in FIG. 7, conduits 211 and 212 are connected to the respective openings in the conduit connecting resin 207. A cooling fluid is introduced through the conduit 211. The cooling fluid passes through all the channels 205 in the module and is then discharged via the conduit 212.

Figure 13:
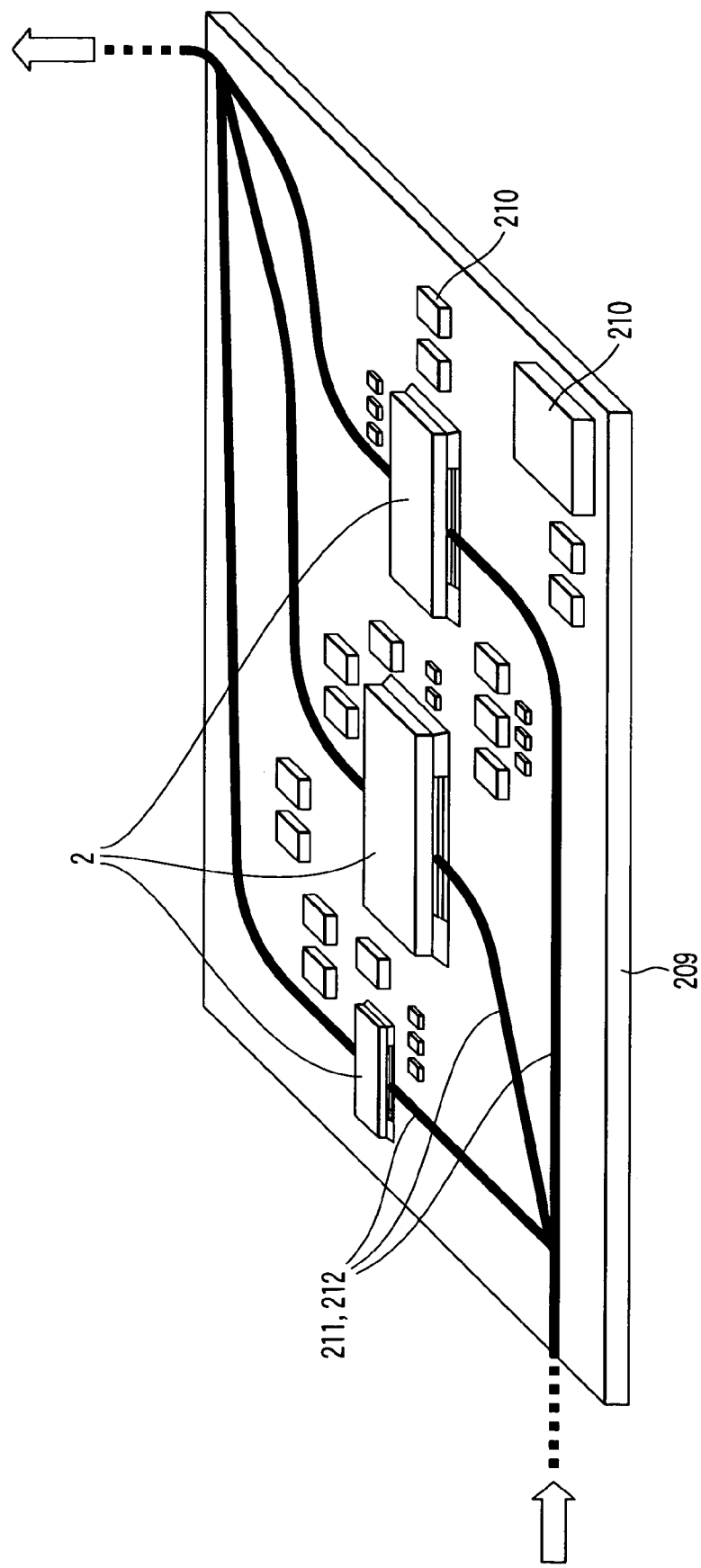
FIG. 13 is a perspective view showing a three-dimensionally mounted semiconductor system using the three-dimensionally mounted semiconductor modules according to the second embodiment.

Furthermore, as shown in FIG. 13, it is possible to provide a three-dimensionally mounted semiconductor system in which the structures shown in FIG. 7 are provided on the mounting substrate 209 as in the case of the first embodiment. A semiconductor device 210 corresponds to the semiconductor device 110.

In the present embodiment, as in the case of the first embodiment, the liquid introduced through the conduit 211 is distributed to the channels 205, each present over and under the corresponding chips. The distributed streams of the liquid then flow in parallel through the very fine gaps having a size on the order of microns. This results in a thermal transfer characteristic far exceeding that of the normal liquid cooling, thus cooling the chips efficiently. Therefore, the present embodiment produces effects similar to those of the first embodiment.

(Third Embodiment)

Now, as a third embodiment, description will be given of forms of various channels each formed between the chips.

FIGS. 8A to 8F show various embodiments of channels each formed between the chips. FIGS. 8A, 8B, and 8C show horizontal cross sections. FIGS. 8B, 8D, and 8F are sectional views taken along lines VIIIB—VIIIB, VIIID—VIIID, and VIIIF—VIIIF in FIGS. 8A, 8B, and 8C, respectively. Reference numerals 302 to 305 correspond to reference numerals 101 to 105 in FIGS. 1A and 1B.

FIGS. 8A and 8B show that two channels are formed. It is thus possible to deal with a further increase in the number of pads (bumps). Furthermore, the increase in the number of pads allows the diameter of the channels to decrease and improves the cooling characteristic, or the distributed channels enables the degree of freedom to significantly increase.

FIGS. 8C and 8D show that the bumps are concentrated in the center of the chip. This makes it possible to deal with the case in which a heated spot exists near the edges of the chip. In this case, sealing the outside of the chip with a resin forms the two channels.

FIGS. 8E and 8F show that the chip is cooled by forming a channel 305 that winds in the form of the letter S so as to run through the entire chip. Such a channel can be freely installed by adjusting the range of sealing resin to a limited area in association with various arrangements of the pads (bumps).

(Fourth Embodiment)

Now, an additional structure between the chips will be described as a fourth embodiment of the present invention. The fourth embodiment is used in addition to one of the first to third embodiments.

Figure 11A:
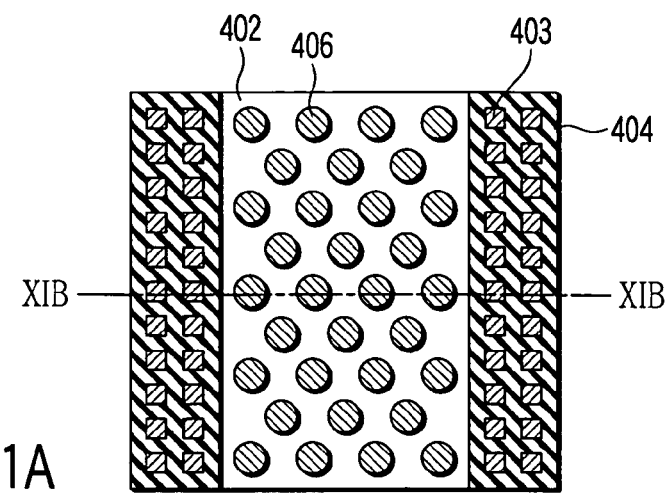
FIG. 11A is a side sectional view schematically showing a part of a three-dimensionally mounted semiconductor module according to a fourth embodiment.
Figure 11B:
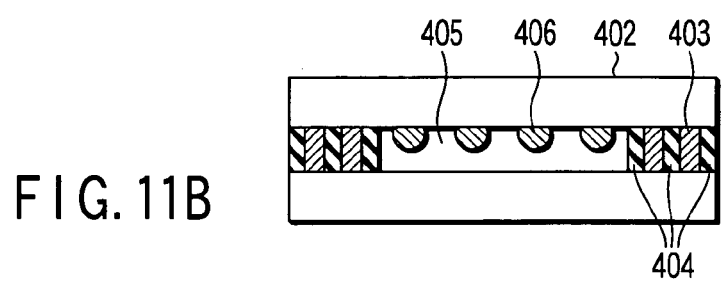
FIGS. 11B, 11C, and 11D are sectional views taken along a line XIB—XIB in FIG. 11A.
Figure 11C:
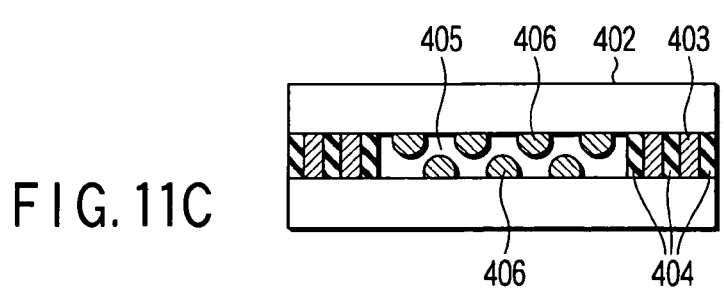
Figure 11D:
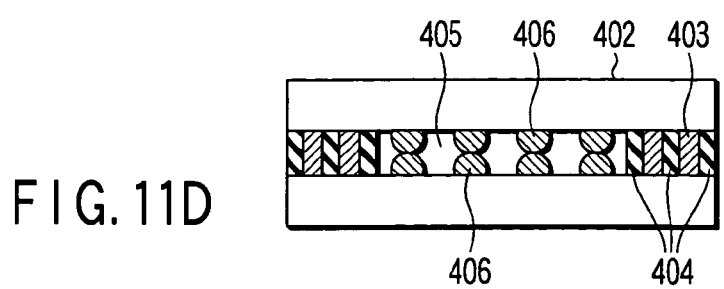

FIGS. 11A to 11D show an additional structure between the chips. FIG. 11A shows a horizontal cross section of the chips. FIGS. 11B to 11D are sectional views taken along a line VIB—VIB in FIG. 11A. Reference numerals 402 to 405 in FIGS. 11A to 11D correspond to reference numerals 101 to 105 in FIGS. 1A and 1B, respectively.

As shown in FIGS. 11A to 1D, dummy bumps 406 are provided in a channel 405 and on a front and/or back surface of semiconductor chips 402. The dummy bumps 406 do not contribute to electrically connecting the chips together. In the cross section shown in FIG. 11A, the dummy bumps 406 are arranged, for example, in lattice form. FIG. 11B shows that the dummy bumps are provided on only one of the two facing surfaces of the two semiconductor chips.

FIG. 11C shows that the dummy bumps 406 are provided on both of the two facing surfaces. The dummy bumps 406 on one of the two surfaces are arranged so as not to contact the dummy bumps 406 on the other surface. That is, the dummy bumps 406 on one of the two surfaces are provided in areas corresponding to the areas in which the dummy bumps 406 on the other surface are not provided.

FIG. 11D shows that the dummy bumps 406 are provided on both of the two facing surfaces like FIG. 1C. In the structure in FIG. 1D, unlike FIG. 1C, the dummy bumps on one surface lie to face the dummy bumps on the other surface. These opposite bumps contact with one another.

According to the structures shown in FIGS. 11A to 1D, the "pin fin" effect of the dummy bumps 406 enhances the cooling effect of a fluid flowing through the channel 405 compared to the case in which no dummy bumps 406 are provided. Thus, highly efficient cooling effect can be achieved. No insulators seal the dummy bumps 406 as opposed to the connection bumps 403. However, this does not cause wire disconnection due to corrosion because the dummy bumps 406 does not form electrical paths. Further, corrosion-proof material like gold can be used to have long lasting dummy bumps 406. This can achieve high reliability in resistance property to environment.

(Variations)

The present invention is not limited to the above-described embodiments. In the above-described embodiments, the channel is installed so as to penetrate the chip from one side to the opposite side. However, the channel may lie by starting from one side and returning to the same side or extending from one side to the adjacent side. Further, it should be appreciated that the effects of the present invention are not impaired even if the number of chips stacked is not four.

In the embodiments, the channels are formed between all the pairs of the opposite chips and between the chip and the substrate. However, the present invention is not necessarily limited to this aspect. The channels are formed between some of the pairs of the opposite chips and/or between the chip and the substrate. Further, the cooling fluid is not limited to water but an organic solvent may be used. Moreover, the cooling fluid is not limited to the liquid but a gas such as air or an inert gas may be used.

Many other variations may be made to the embodiments without departing from the spirit of the invention.

As described above, according to the embodiments of the present invention, when the stacked semiconductor chips are sealed, only the connection bump portions of each semiconductor chip are sealed with the sealing resin instead of filling the sealing resin into the entire space between the chips and between the chip and the substrate. Consequently, cavities are formed at those positions between the chips and between the chip and the substrate where the connection bumps are not present. Here, when the positions of the connection bumps in the semiconductor chip are optimally set, the cavities formed between the chips and between the chip and the substrate can be used to form channels extending, for example, from one side to another side of each chip. Then, when the cooling fluid flows through the channels, it can directly contact with all the semiconductor chips to cool them. Thus, even semiconductor chips located in inner layers can be adequately cooled.

The connection bumps are essential to the semiconductor chips. In embodiments of the present invention, it is only necessary to set the formed positions of the connection bumps in accordance with the channels to be formed between the chips and between the chip and the substrate. This avoids the need to execute complicated micromachining on the back surface of the chip to form microchannels. It is thus possible to suppress the complication of the manufacturing process and an increase in manufacturing costs.

As described above in detail, according to the embodiments of the present invention, in a three-dimensionally mounted semiconductor module in which semiconductor chips are stacked on an interconnect substrate, channels are formed between the chips and between the chip and the substrate using a sealing resin that seals connection bumps. Thus, the module can be efficiently cooled without the need for complicated machining for microchannel cooling, even with an increase in the number of chips stacked. Further, semiconductor chips in inner layers can be adequately cooled.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor module comprising:
    an interconnect substrate having a first main surface;
    a plurality of semiconductor chips stacked on the first main surface, the semiconductor chips having a base and connection bumps, mutually facing two of the bases and the interconnect substrate being apart from each other, the connection bumps electrically connecting the mutually facing two of the bases and the interconnect substrate together; and
    a plurality of insulating sealing members which seal the connection bumps, the seating members filling spaces between the mutually facing two of the bases and the interconnect substrate, the sealing members having cavities penetrating the sealing members, ends of the cavities being connected to conduits, a cooling fluid being supplied to the cavities through one of the conduits and being discharged from the cavities through another one of the conduits.

2. The module according to claim 1, wherein in a plane along the first main surface, the cavities extend from a first side of sides defining a shape of one of the semiconductor chip to a second one of the sides.

3. The module according to claim 1, wherein the connection bumps are placed at position which is to be side walls of the cavities according to a required shape of the cavities in a plane along the first main surface.

4. The module according to claim 1, wherein a first semiconductor chip of the semiconductor chips is in a rectangular shape in a first plane which is along the first main surface,
    the connection bumps are formed along a pair of opposite sides of the first semiconductor chip in the first plane; and
    the cavities extend between a remaining pair of sides of the first semiconductor chip in the first plane.

5. The module according to claim 1, further comprising substrate connecting terminals provided on a second main surface opposite to the first main surface to electrically connect the interconnect substrate to a mounting substrate which faces the second main surface.

6. A semiconductor module comprising:
    an interconnect substrate having a first main surface;
    a plurality of semiconductor chips stacked on the first main surface, the semiconductor chips having a base and connection bumps, mutually facing two of the bases and the interconnect substrate being apart from each other, the connection bumps electrically connecting the mutually facing two of the bases and the interconnect substrate together;
    a plurality of insulating sealing members which seal the connection bumps, the sealing members filling spaces between the mutually facing two of the bases and the interconnect substrate, the sealing members having cavities penetrating the sealing members; and
    substrate connecting terminals provided on the first main surface to electrically connect the interconnect substrate to a mounting substrate which faces the first main surface.

7. The module according to claim 1, wherein water or an organic solvent is allowed to flow through the cavities.

8. The module according to claim 1, wherein air or an inert gas is allowed to flow through the cavities.

9. A semiconductor module comprising:
    an interconnect substrate having a first main surface;
    a plurality of semiconductor chips stacked on the first main surface, the semiconductor chips having a base and connection bumps, mutually facing two of the bases and the interconnect substrate being apart from each other, the connection bumps electrically connecting the mutually facing two of the bases and the interconnect substrate together;
    a plurality of insulating sealing members which seal the connection bumps, the sealing members filling spaces between the mutually facing two of the bases and the interconnect substrate, the sealing members having cavities penetrating the sealing members; and
    a plurality of first dummy bumps which are provided in the cavities on a first semiconductor chip of the semiconductor chips and which are electrically independent of an interior of the first semiconductor chip.

10. The module according to claim 9, further comprising a plurality of second dummy bumps provided on a second semiconductor chip of the semiconductor chips which faces the first semiconductor chip, the second dummy bumps being arranged in a plane along the first main surface where the first dummy bumps are not arranged, the second dummy bumps being electrically independent of an interior of the second semiconductor chip.

11. The module according to claim 9, further comprising a plurality of second dummy bumps provided on a second semiconductor chip of the semiconductor chips which faces the first semiconductor chip, the second dummy bumps being arranged in a plane along the first main surface at the positions where the first dummy bumps are arranged, the second dummy bumps contacting with the first dummy bumps, the second dummy bumps being electrically independent of an interior of the second semiconductor chip.

12. A semiconductor system comprising:
a mounting substrate on which a plurality of the semiconductor modules according to claim 1 are mounted; and
a cooling fluid supply pipe connected to the semiconductor modules.

13. A semiconductor module comprising:
an interconnect substrate having a first main surface;
a plurality of semiconductor chips stacked on the first main surface, the semiconductor chips having a base and connection bumps, mutually facing two of the bases and the interconnect substrate being apart from each other, the connection bumps electrically connecting the mutually facing two of the bases and the interconnect substrate together, the connection bumps being in line in a first plane along the first main surface to form paths, ends of the paths being connected to conduits, a cooling fluid being supplied to the paths through one of the conduits and being discharged from the paths through another one of the conduits; and
a plurality of insulating sealing members which seal the connection bumps without burying the paths.

14. The module according to claim 13, wherein in the first plane, the paths extend from a first side of sides defining a shape of one of the semiconductor chips, to a second one of the sides.

15. The module according to claim 13, wherein a first semiconductor chip of the semiconductor chips is in a rectangular shape in the first plane,
the connection bumps are formed along a pair of opposite sides of the first semiconductor chip in the first plane; and
the paths extend between a remaining pair of sides of the first semiconductor chip in the first plane.

16. The module according to claim 13, further comprising substrate connecting terminals provided on a second main surface opposite to the first main surface to electrically connect the interconnect substrate to a mounting substrate which faces the second main surface.

17. A semiconductor module comprising:
an interconnect substrate having a first main surface;
a plurality of semiconductor chips stacked on the first main surface, the semiconductor chips having a base and connection bumps, mutually facing two of the bases and the interconnect substrate being apart from each other, the connection bumps electrically connecting the mutually facing two of the bases and the interconnect substrate together, the connection bumps being in line in a first plane along the first main surface to form paths;
a plurality of insulating sealing members which seal the connection bumps without burying the paths; and
substrate connecting terminals provided on the first main surface to electrically connect the interconnect substrate to a mounting substrate which faces the first main surface.

18. A semiconductor module comprising:
an interconnect substrate having a first main surface;
a plurality of semiconductor chips stacked on the first main surface, the semiconductor chips having a base and connection bumps, mutually facing two of the bases and the interconnect substrate being apart from each other, the connection bumps electrically connecting the mutually facing two of the bases and the interconnect substrate together, the connection bumps being in line in a first plane along the first main surface to form paths;
a plurality of insulating sealing members which seal the connection bumps without burying the paths; and
a plurality of first dummy bumps which are disposed in the path on the first semiconductor chip of the semiconductor chips and which are electrically independent of an interior of the first semiconductor chip.

19. A semiconductor system comprising:
a mounting substrate on which a plurality of the semiconductor modules according to claim 14 are mounted; and
a cooling fluid supply pipe connected to the semiconductor modules.

\* \* \* \* \*